(12) United States Patent
Gardner et al.

(10) Patent No.: US 7,518,481 B2
(45) Date of Patent: Apr. 14, 2009

(54) SLOTTED MAGNETIC MATERIAL FOR INTEGRATED CIRCUIT INDUCTORS

(75) Inventors: Donald S. Gardner, Mountain View, CA (US); Gerhard Schrom, Hillsboro, OR (US); Peter Hazucha, Beaverton, OR (US); Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 11/479,236

(22) Filed: Jun. 30, 2006

(65) Prior Publication Data
US 2008/0001699 A1    Jan. 3, 2008

(51) Int. Cl.
*H01F 5/00*    (2006.01)
(52) U.S. Cl. .................. 336/200; 336/232; 336/223

(58) Field of Classification Search ............. 336/200, 336/223, 232
See application file for complete search history.

(56) References Cited

U.S. PATENT DOCUMENTS

| | | | |
|---|---|---|---|
| 6,342,778 B1 * | 1/2002 | Catalano et al. | 323/224 |
| 6,414,582 B1 * | 7/2002 | Brkovic et al. | 336/200 |
| 6,870,456 B2 * | 3/2005 | Gardner | 336/200 |
| 2005/0174207 A1 * | 8/2005 | Young et al. | 336/200 |

* cited by examiner

*Primary Examiner*—Anh T Mai
(74) *Attorney, Agent, or Firm*—Kacvinsky LLC

(57) ABSTRACT

An embodiment is an inductor that may include a slotted magnetic material to decrease eddy currents therein that may limit the operation of the inductor at high frequency. An embodiment may employ electro- or electroless plating techniques to form a layer or layers of magnetic material within the slotted magnetic material structure, and in particular those magnetic material layers adjacent to insulator layers.

11 Claims, 10 Drawing Sheets

100

300

301

SLOTTED MAGNETIC MATERIAL FOR INTEGRATED CIRCUIT INDUCTORS

BACKGROUND

Inductors and transformers may be used in many different types of circuits. For example, they may be used for radio frequency (RF) circuits and high-frequency power distribution or conversion systems, such as a DC-DC voltage (or power) converter. Currently voltage converters may not be fully integrated on-chip for a variety of reasons. For example, a desired operating frequency may require an inductance value that is unobtainable based on the constrained physical size of the inductor. Further, in particular based on the effects of eddy currents, an on-chip inductor may not have a sufficiently high operating frequency for an RF or high-frequency voltage conversion application.

There are advantages to integrating a power system, for example including a DC-DC voltage converter, on the same die as the circuit(s) that are powered thereby. For example, as processor technology scales to smaller dimensions, supply voltages to circuits within a processor may also scale to smaller values. However, as the dimensions decrease, power consumption of the processor may increase. Using an off-die voltage converter to provide a small supply voltage to a processor with a large power consumption leads to a large total electrical current being supplied to the processor. This may increase the electrical current per pin, or the total number of pins required to power the processor as each pin has a maximum current handling capability. Also, an increase in supply current can lead to an increase in resistive as well as inductive voltage drop across various off-die and on-die interconnects, and to a higher cost for decoupling capacitors. Integrating the voltage converter onto the die may mitigate these and other problems.

DETAILED DESCRIPTION

Figure 1:
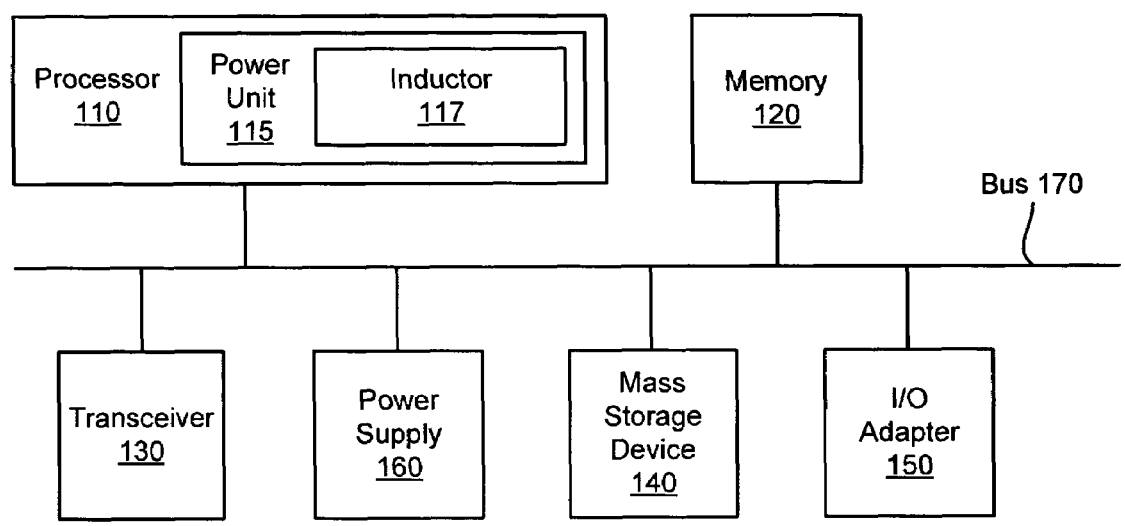
FIG. 1 illustrates a block diagram of a system of an embodiment

Embodiments of a slotted magnetic material for inductors in integrated circuits and the method of manufacture thereof will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment is an inductor that may include a slotted material structure to decrease eddy currents therein that may limit the operation of the inductor at high frequency. The inductor of an embodiment may include a plurality of metal lines substantially or completely surrounded by a magnetic material. The inductor of an embodiment may also include a slotted magnetic layer or layers that may further include a plurality of insulator slots. The increased resistance of the slotted magnetic layer or layers may reduce eddy currents within the inductor and subsequently improve the performance of the inductor at higher frequencies. An embodiment may employ electroplating and/or electroless plating techniques to form a layer or layers of magnetic material, and in particular those layers within the insulator slots.

FIG. 1 illustrates a partial block diagram for a device 100. Device 100 may comprise several elements, components or modules, collectively referred to herein as a "module." A module may be implemented as a circuit, an integrated circuit, an application specific integrated circuit (ASIC), an integrated circuit array, a chipset comprising an integrated circuit or an integrated circuit array, a logic circuit, a memory, an element of an integrated circuit array or a chipset, a three-dimensional (3-D) stacked integrated circuit array, a processor, a digital signal processor, a programmable logic device, code, firmware, software, and any combination thereof. Although FIG. 1 is shown with a limited number of modules in a certain topology, it may be appreciated that device 100 may include more or less modules in any number of topologies as desired for a given implementation. The embodiments are not limited in this context.

In one embodiment, device 100 may comprise a mobile device. For example, mobile device 100 may comprise a computer, laptop computer, ultra-laptop computer, handheld computer, cellular telephone, personal digital assistant (PDA), wireless PDA, combination cellular telephone/PDA, portable digital music player, pager, two-way pager, mobile subscriber station, and so forth. The embodiments are not limited in this context.

In one embodiment, device 100 may include a processor 110. Processor 110 may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. In one embodiment, for example, processor 110 may be implemented as a general purpose processor, such as a processor made by Intel® Corporation, Santa Clara, Calif. Processor 110 may also be implemented as a dedicated processor, such as a controller, microcontroller, embedded processor, a digital signal processor (DSP), a network processor, a media processor, an input/output (I/O) processor, a media access control (MAC) processor, a radio baseband processor, a field programmable gate array (FPGA), a programmable logic device (PLD), and so forth. The processor of an embodiment may further include on-chip one or more power units 115 to regulate power to the processor 110. Each power unit 115 may include, among other components not illustrated, one or more on-chip inductors 117 as will be described more fully below. In an embodiment, the processor 110 may include multiple power units (each with one or more inductors) that each supply a different voltage to different portions of the processor 110. The embodiments are not limited in this context.

In one embodiment, the device 100 may include a memory 120 to couple to processor 110. Memory 120 may be coupled to processor 110 via bus 170, or by a dedicated bus between processor 110 and memory 120, as desired for a given implementation. Memory 120 may be implemented using any machine-readable or computer-readable media capable of storing data, including both volatile and non-volatile memory. For example, memory 120 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of memory 120 may be included on the same integrated circuit as processor 110, or alternatively some portion or all of memory 120 may be disposed on an integrated circuit or other medium, for example a hard disk drive, that is external to the integrated circuit of processor 110. The embodiments are not limited in this context.

In various embodiments, device 100 may include a transceiver 130. Transceiver 130 may be any radio transmitter and/or receiver arranged to operate in accordance with a desired wireless protocols. Examples of suitable wireless protocols may include various wireless local area network (WLAN) protocols, including the IEEE 802.xx series of protocols, such as IEEE 802.11a/b/g/n, IEEE 802.16, IEEE 802.20, and so forth. Other examples of wireless protocols may include various wireless wide area network (WWAN) protocols, such as Global System for Mobile Communications (GSM) cellular radiotelephone system protocols with General Packet Radio Service (GPRS), Code Division Multiple Access (CDMA) cellular radiotelephone communication systems with 1xRTT, Enhanced Data Rates for Global Evolution (EDGE) systems, and so forth. Further examples of wireless protocols may include wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles (collectively referred to herein as "Bluetooth Specification"), and so forth. Other suitable protocols may include Ultra Wide Band (UWB), Digital Office (DO), Digital Home, Trusted Platform Module (TPM), ZigBee, and other protocols. The embodiments are not limited in this context.

In various embodiments, device 100 may include a mass storage device 140. Examples of mass storage device 140 may include a hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of DVD devices, a tape device, a cassette device, or the like. The embodiments are not limited in this context.

In various embodiments, the device 100 may include one or more I/O adapters 150. Examples of I/O adapters 150 may include Universal Serial Bus (USB) ports/adapters, IEEE 1394 Firewire ports/adapters, and so forth. The embodiments are not limited in this context.

In one embodiment, device 100 may receive main power supply voltages from a power supply 160 via bus 170. It is to be understood that as illustrated herein, bus 170 may represent both a communications bus as well as a power bus over which the various modules of device 100 may be energized. Further, as introduced with respect to power unit 115 including inductor 117, and multiple instances thereof within the same processor, power supply 160 may supply, for example, a voltage to the processor 110 that may be converted by the power unit 115 to a different voltage. In an embodiment, the voltage from power supply 160 may be converted to several different voltages by a plurality of power units (e.g., power unit 115) within processor 110 to supply various portions of the processor 110 that may have different voltage requirements.

Figure 2:
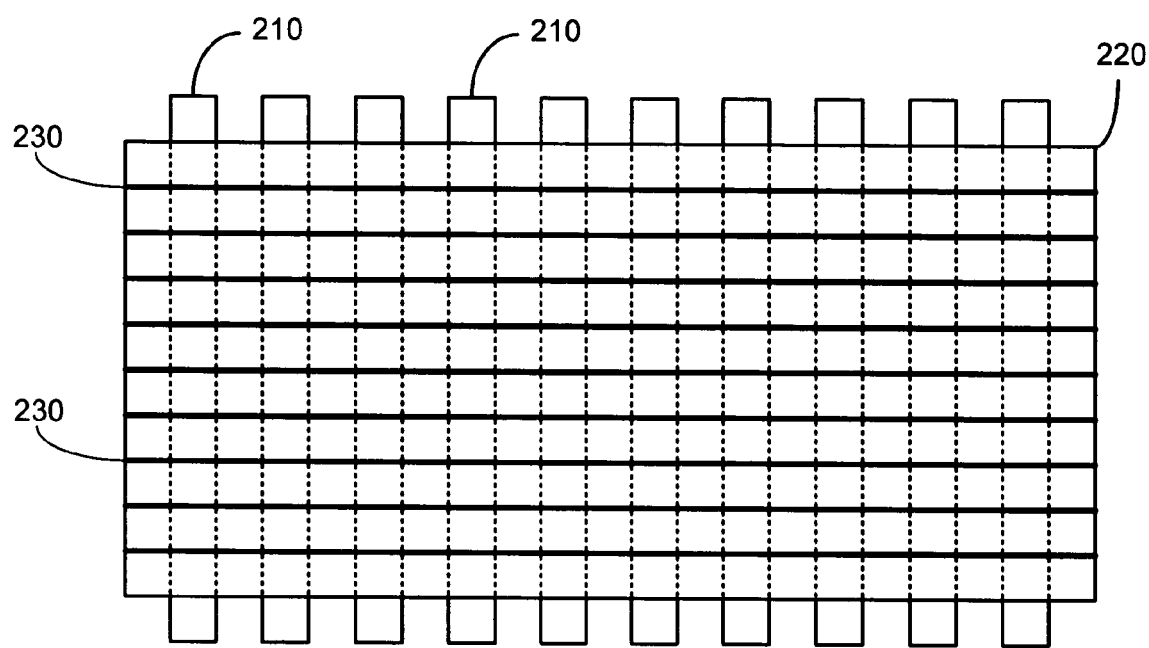
FIG. 2 illustrates a top view of an inductor of an embodiment

FIG. 2 through FIG. 10 more specifically describe, for example, the inductor 117 of an embodiment that may be included on the same die as processor 110 or other integrated circuit. FIG. 2 illustrates a simplified top view of inductor 200 that may be integrated on a die. The transformer 100 may include metal lines (conductors) 210 formed parallel to each other by standard silicon processing techniques directed to forming metal features. Magnetic material 220 may be deposited above and below the parallel metal lines 210, and around the leftmost and rightmost parallel metal lines 210 to form a closed magnetic circuit and to provide a large inductance and magnetic coupling among the metal lines 210. The inclusion of the magnetic material, and the substantial or complete enclosure of the metal lines 210 thereby, may increase the magnetic coupling between the metal lines 210 of the inductor 200 for a given size of the inductor 200. For simplicity, FIG. 2 shows the magnetic material 220 only above the metal lines 210 although the magnetic material may also be below and on the sides of the metal lines 210. Further, magnetic material 220 may be a slotted magnetic material including a plurality of slots as separated by a plurality of insulator walls 230 to mitigate the eddy current within the inductor 200.

Figure 3:
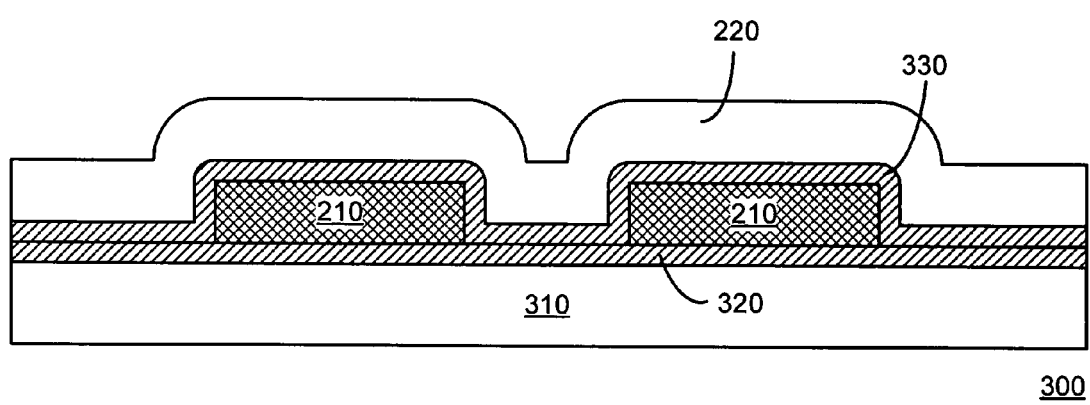
FIG. 3 illustrates a side view of the inductor of FIG. 2
Figure 3:
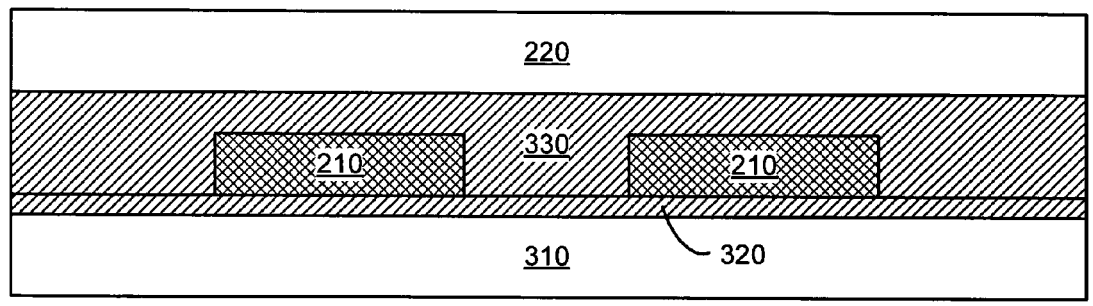

FIG. 3 illustrates a side view of the inductor of FIG. 2 of an embodiment. More specifically, FIG. 3 shows that the metal lines 210 are insulated from each other and from the magnetic material 220 by an insulating material 330 above the metal lines 210, and by insulating material 320 from magnetic material 310 below the metal lines 210. In an embodiment, the insulating materials 320 and 330 may comprise $SiO_2$, SiN, SiOF, SiOC, polyimide, a photosensitive insulating material, or any other low dielectric constant interlayer dielectric (low-k ILD). The magnetic materials 220 and 310 of an embodiment may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, or a combination thereof. The insulating material 320 and 330 deposited around the metal lines 210, and in any end gap in the magnetic material 310 and 220 (if present) may have a smaller magnetic permeability than that of the magnetic material 310 and 220. The smaller magnetic permeability of the insulating material may improve the magnetic coupling between the metal lines 210. For example, the relative permeability of the magnetic material 310 and 220 may be greater than 100 and the relative permeability of the insulating material 320 and 330 may approach 1.

As illustrated by FIG. 3, the metal lines 210 are formed in only one layer. Forming metal lines 210 within one layer may reduce the number of metal levels needed and may further reduce the capacitance between the metal lines 210 versus forming metal lines on top of each other. Further, it is to be understood that an embodiment may include more or fewer metal lines 210 depending on the inductance value required of the inductor 200 and available integrated circuit (e.g., processor 110) real estate that the inductor 300 may occupy.

Also illustrated by FIG. 3 is inductor 301 representing an alternate arrangement of the constituent layers. Of note is the arrangement of the insulating material 330. Compared to inductor 300, the insulating material 330 of inductor 301 may be formed about and above the metal lines 210 to a thickness substantial enough that the surface of the insulating material 330 may thereafter be planarized (e.g., with chemical mechanical polishing, or CMP) while still maintaining a sufficient thickness, for example, above the metal lines 210. The magnetic material 220 may thereafter be formed atop the planarized surface of the insulating material 330.

Figure 4:
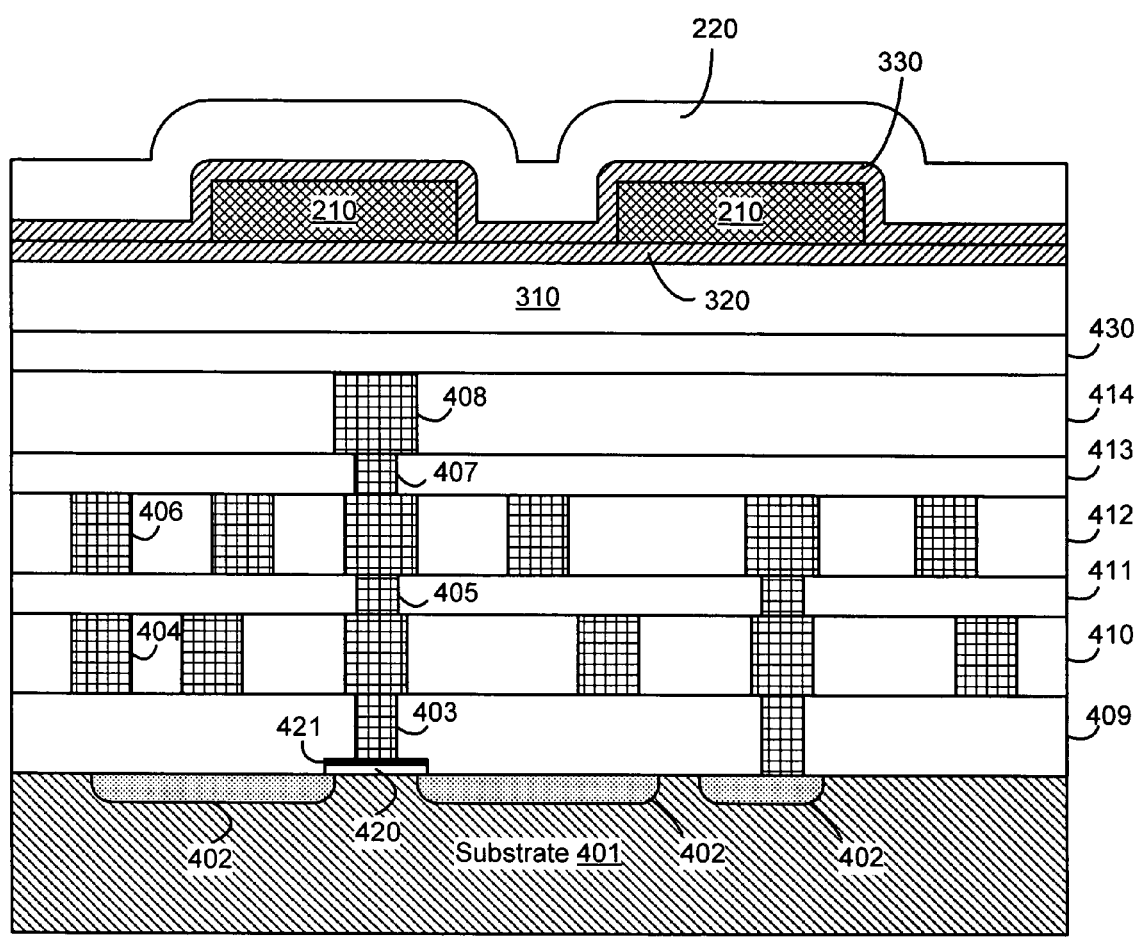
FIG. 4 illustrates a side view of the inductor of FIG. 2 formed on an integrated circuit

FIG. 4 illustrates a side view of the inductor of FIG. 2 formed on an integrated circuit 400. In an embodiment, the integrated circuit 400 has a dual damascene architecture. A substrate 401 contains any variety of semiconductor devices well known to those skilled in the art as represented rudimentarily by source and drain regions 402, dielectric 420, and gate 421 of a metal oxide semiconductor ("MOS") transistor. Interconnect levels 404, 406, and 408 are representative of, for example, the trench level of a dual-damascene interconnect structure, for which via levels 403, 405, and 407 provide electrical contact between interconnect layers and between interconnect layers and semiconductor devices. ILD layers 409 through 414 are formed of, for example, a low-k dielectric material. The ILDs not only isolate interconnects on different layers, but also isolate interconnects on the same layer. It is to be understood that there may be more or fewer interconnect levels depending on the nature and complexity of the fabricated devices as is well known in the art. Further, while illustrated as, for example, inductor 300 it is to be understood that inductor 301 may similarly be formed as part of the integrated circuit 400.

Figure 5:
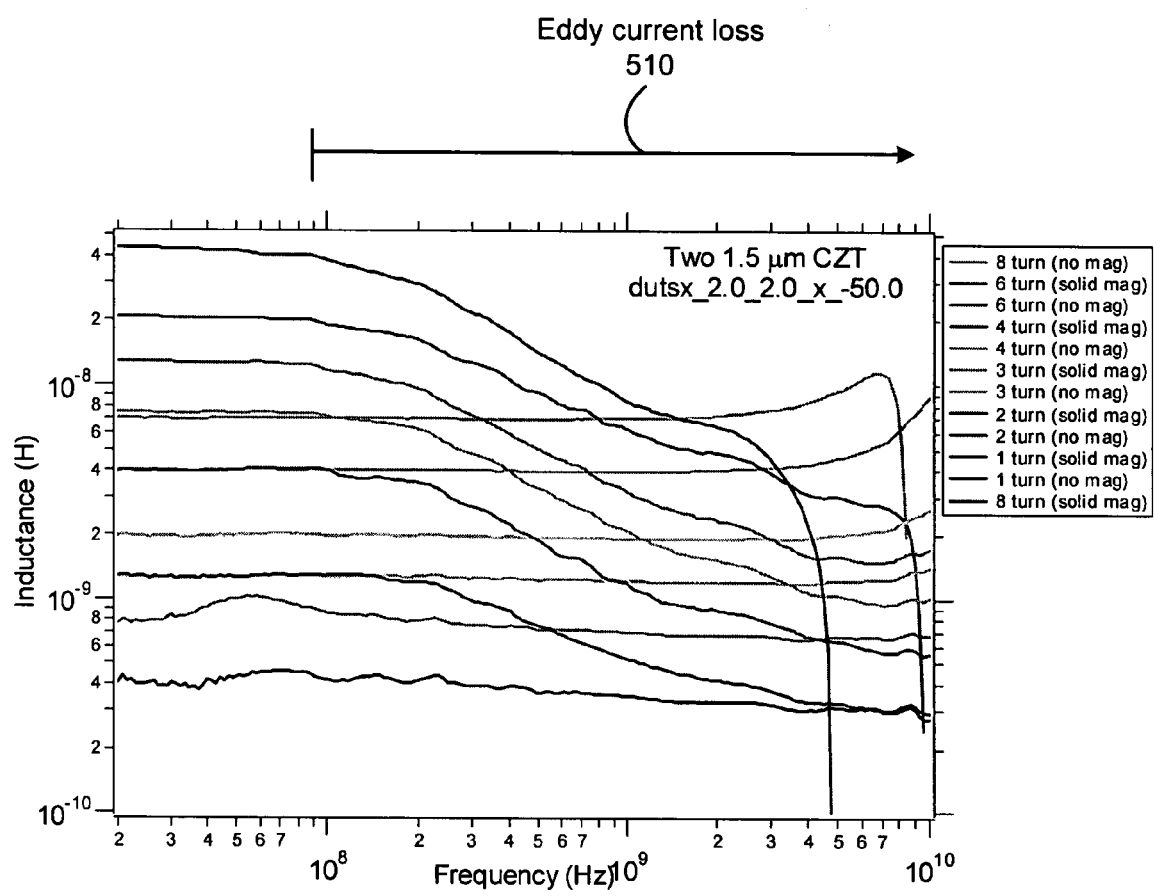
FIG. 5 illustrates a graph of frequency versus inductance for inductors of embodiments

FIG. 5 illustrates a graph of frequency versus inductance for inductors of embodiments. Inductors (e.g. inductor 200 of an embodiment) including magnetic materials are useful for RF and wireless circuits as well as power converters and EMI noise reduction. Integrated on-die DC-DC converters may be important for controlling the power consumption in multicore and many core processor applications. For example, the inductor 200 of an embodiment may be included in an on-chip integrated DC-DC converter at high power levels of approximately 100 W or more that may supply power to a processor, chipset, or other circuits. However, as inductor 200 operates at higher frequencies, the inductor may experience an eddy current related loss 510 from increased resistance causing the inductor 200 to exhibit an apparent reduction in inductance.

More specifically, the eddy current loss 510 region illustrates the loss as a downward slope of the inductance value as operating frequency increases. The eddy current loss becomes particularly cumbersome as the thickness of the magnetic material (e.g., magnetic materials 310 and 220) increases. Said alternatively, as noted voltage converters are one possible application for inductors with magnetic materials. The length of the wires that make up inductors for power converters should to be as short as possible to reduce resistive losses. Accordingly, the operating frequency should be increased to reduce the required inductance. Further, the magnetic material (e.g., magnetic materials 310 and 220) should be thick to obtain more inductance per unit area for efficient voltage conversion. An noted, the thicker magnetic materials together with higher frequencies may increase eddy current loss as thicker materials may have a lower resistance.

Figure 6:
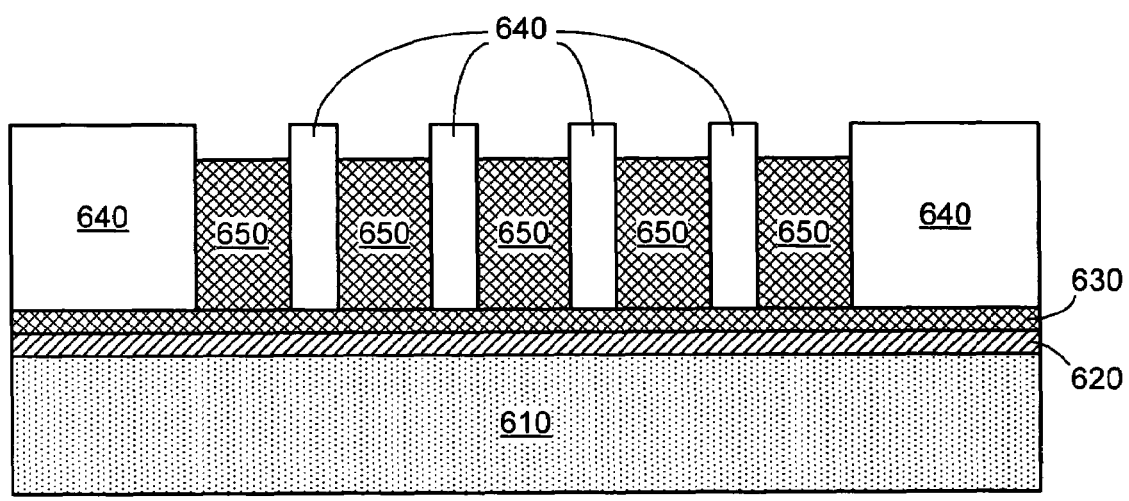
FIG. 6 illustrates a side view of a slotted magnetic material of an embodiment

FIG. 6 illustrates a side view a slotted magnetic material 600 of an embodiment. As noted, as the thickness of the magnetic material (e.g. magnetic material 310 and 220) is increased, the resistance decreases and eddy current losses may decrease the effective inductance of the inductor. Slotted magnetic material 600 of an embodiment as part of, for example, inductor 300 may decrease the eddy currents. Accordingly, an inductor including slotted magnetic material 600 of an embodiment may exhibit improved inductance, and in particular at higher frequencies at which eddy current losses may otherwise be significant, compared to an inductor with monolithic magnetic material layers.

More specifically, an effective method for reducing the eddy currents is to form slots within the magnetic material with insulating pillars or walls (e.g. insulator walls 230 of FIG. 2). For example, the slotted magnetic material 600 may be a bottom layer onto which a plurality of metal lines will be formed. Insulator 610 may separate the slotted magnetic material from any underlying layers (e.g., layer 430 as illustrated by FIG. 4). In an embodiment, insulator 610 may be a $SiO_2$, SiN, SiOF, SiOC, polyimide, a photosensitive insulating material, or any other low-k ILD. A layer of low resistance material 620 may be formed adjacent to the insulator 610. In an embodiment, the low resistance material 620 may be copper or cobalt. A seed layer of magnetic material 630 may be formed adjacent to the layer of low resistance material 620. In an embodiment, the seed layer of magnetic material 630 may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, or a combination thereof. The seed layer of magnetic material 630 may be formed with sputtering. Photoresist can then be deposited onto the seed layer and then patterned to form openings to the underlying seed layer of magnetic material 630 exposing areas where magnetic material 650 may be deposited. Having exposed the seed layer of magnetic material 630, additional magnetic material 650 may be deposited within the slots contained in the patterned insulator 640. The magnetic material 650 may be blanket deposited (e.g., by sputtering) and chemical mechanical polished (CMP) or may be selectively deposited with electroplating or electroless plating utilizing the exposed seed layer of magnetic material 630. Electroless plating, or chemical or auto-catalytic plating, is a non-galvanic type of plating method that involves several simultaneous reactions in an aqueous solution that occur without the use of external electrical power and does not require that the deposition substrate (for example, low resistance material 620) be electrically conductive. Insulator 640 may thereafter be formed by removing the photoresist and then removing the seed layer underneath the photoresist. Next, deposit a blanket layer of, for example $SiO_2$, SiN, SiOF, SiOC, polyimide, a photosensitive insulating material, or any other low-k ILD over the structure. The slots of magnetic material 650 may decrease the eddy current within an inductor containing slotted magnetic material 600.

Figure 7:
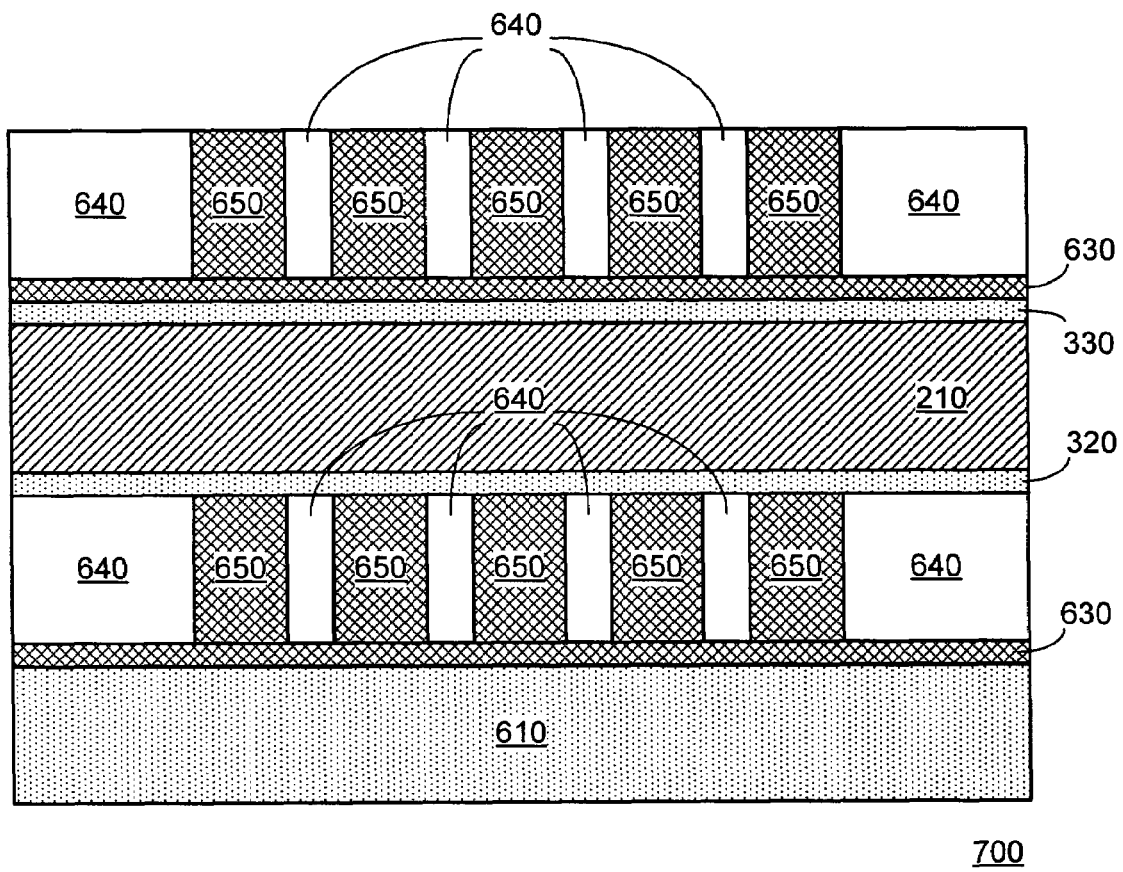
FIG. 7 illustrates a side view of an inductor of an embodiment along the longitudinal cross section of a metal line including a slotted magnetic material

FIG. 7 illustrates a side view of an inductor 700 of an embodiment along the longitudinal cross section of metal line 210 including a slotted magnetic material formed above and below the metal line 210 with electroless plating. For example, as noted, in the embodiment for which electroless plating is utilized for the seed layer of magnetic material 630, the low resistance layer 620 may be omitted as electroless plating does not require an electrically conductive substrate. While inductor 700 of an embodiment may be illustrated without a layer of low resistance material 620 for both the slotted magnetic material 600 above and below the metal line 210, in an embodiment, the bottom slotted magnetic material 600 may include a layer of low resistance material 620. For example, for a given magnetic material, it may be more desirable to form the seed layer of magnetic material 630 with electroplating versus electroless plating for which the layer of low resistance material 620 would be necessary. For the bottom layer of slotted magnetic material 600, the layer of low resistance material 620 may be sufficiently distant from the metal line 320 such that the magnetic field would not substantially penetrate the layer of low resistance material 620 and cause eddy currents. Conversely, if included in the top layer of slotted magnetic material 600, the low resistance material 620 may be proximal to the metal line 320 and be subject to eddy currents generated by the magnetic field. Accordingly, in an embodiment, at least the top slotted magnetic material 600 omits the low resistance material 620 and the seed layer of magnetic material 630 may be formed with electroless plating.

Figure 8:
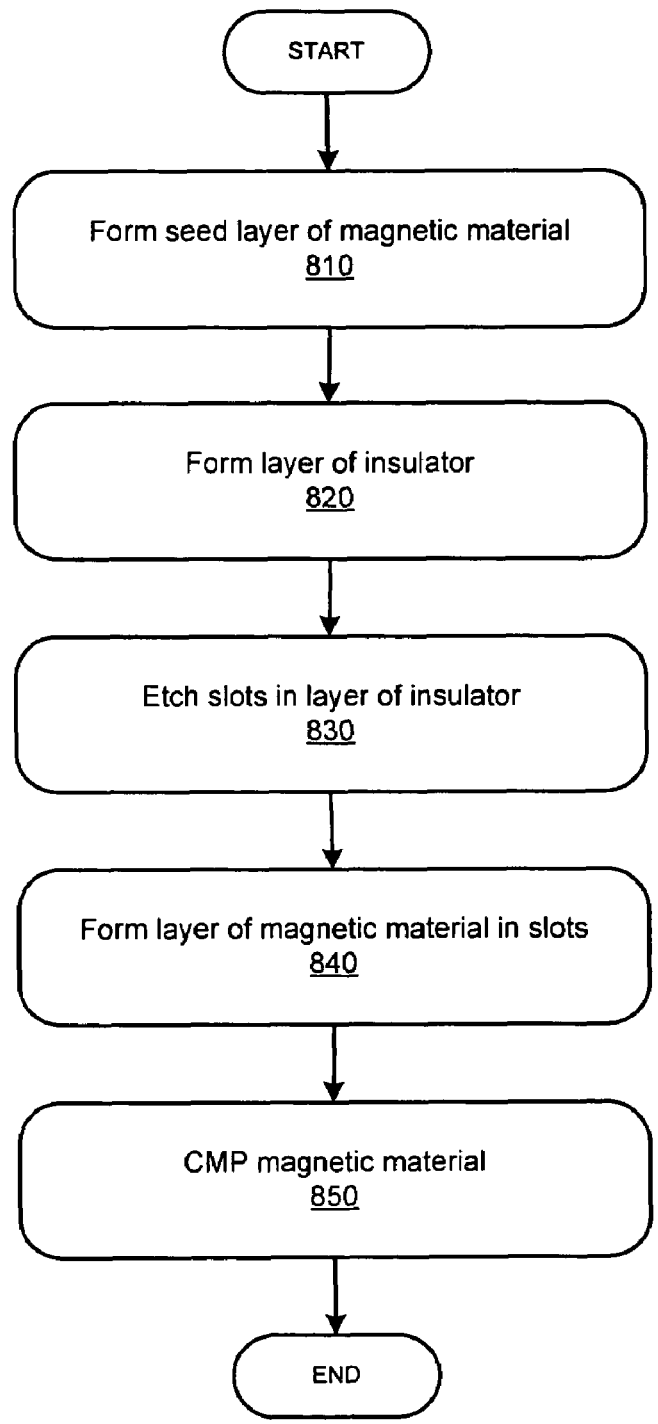
FIG. 8 illustrates a process flow of an embodiment

FIG. 8 illustrates the logic flow of an embodiment to form slotted magnetic layer 600. At 810, the seed layer of magnetic material 630 is formed. In an embodiment, the seed layer of magnetic material 630 is formed with sputtering, chemical vapor deposition (CVD), evaporation, or electroplating atop low resistance material 620. In a further embodiment, the seed layer of magnetic material 630 may be formed with electroless plating, obviating the inclusion of low resistance material 620. In an embodiment, the seed layer may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, or a combination thereof. At 820, a layer of insulator is formed. In an embodiment, the insulator may be $SiO_2$, SiN, SiOF, SiOC, polyimide, a photosensitive insulating material, or any other low-k ILD and may have a thickness of approximately between 0.5 and 10 microns. Thereafter, at 830, slots are etched in the layer of insulator to form patterned insulator 640. In an embodiment, the etch may generate a 2:1 aspect ratio etch with a width of approximately between 0.5 and 5 microns. In particular, the etch extends through the layer of insulator to the underlying seed layer of magnetic material 630. At 840, magnetic material 650 is formed in the slots above the exposed seed layer of magnetic material 630. In an embodiment, the magnetic material 650 may be formed with electroplating, electroless plating, evaporation, CVD, or sputtering. The electroplating may be selective in that magnetic material 650 may only be deposited adjacent to exposed portions of the seed layer of magnetic material 630. At 850, the magnetic material in excess of the height of the layer of insulator may be removed with CMP to form the slots of magnetic material 650 as well as remove the magnetic material 650 from other surfaces.

Figure 9:
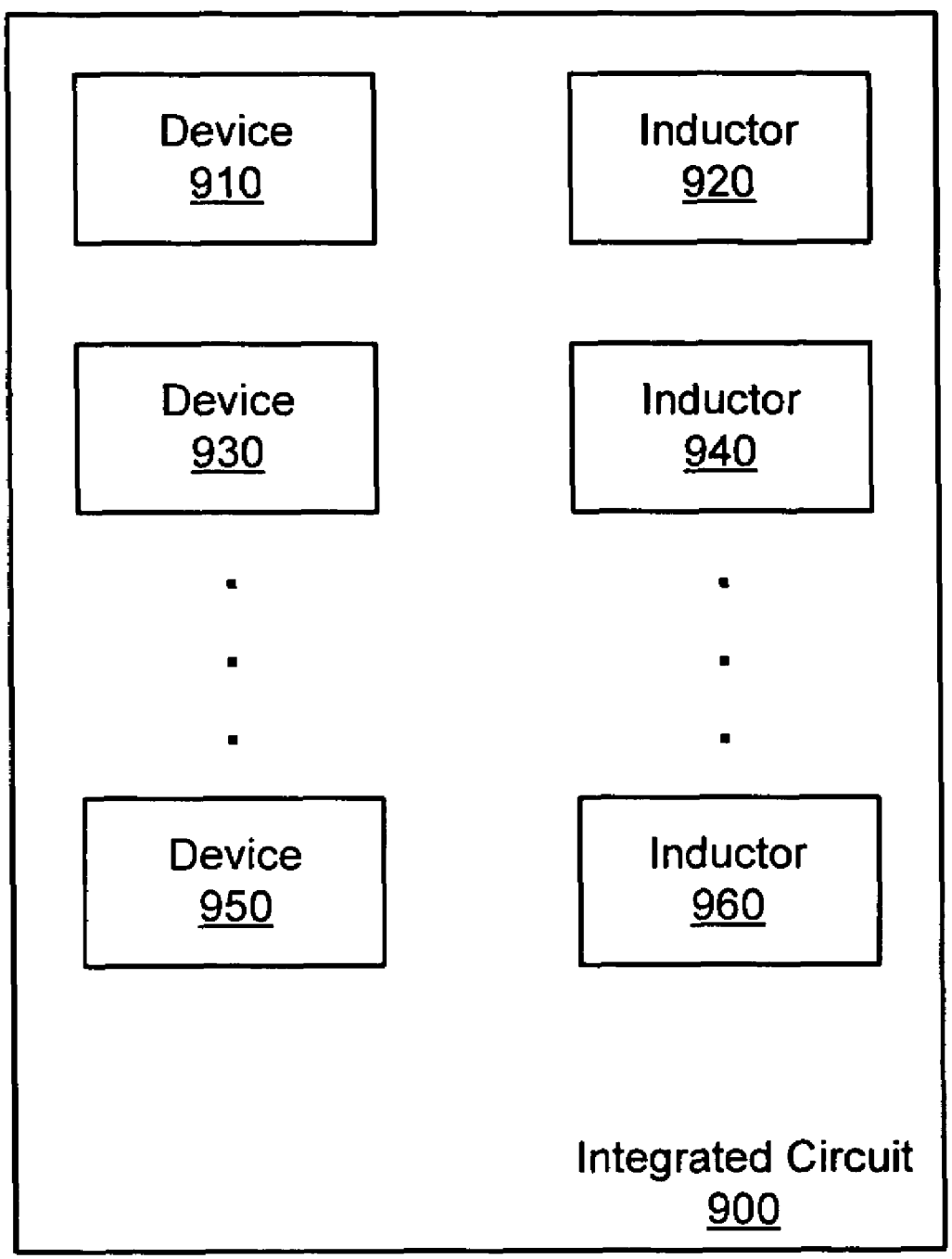
FIG. 9 illustrates a block diagram of an integrated circuit including an inductor of an embodiment

FIG. 9 illustrates a block diagram of an integrated circuit including an inductor of an embodiment. More specifically, FIG. 9 illustrates that one or more inductors (e.g., inductors 920, 940, and 960) may be integrated in an integrated circuit 900 with any suitable one or more integrated circuit devices, such as integrated circuit devices 910, 930, and 950. Each inductor 920, 940, and 960 may be structured and fabricated as described above. Although illustrated as having three inductors, the integrated circuit 900 of an embodiment may be fabricated with any suitable number of one or more inductors.

Figure 10:
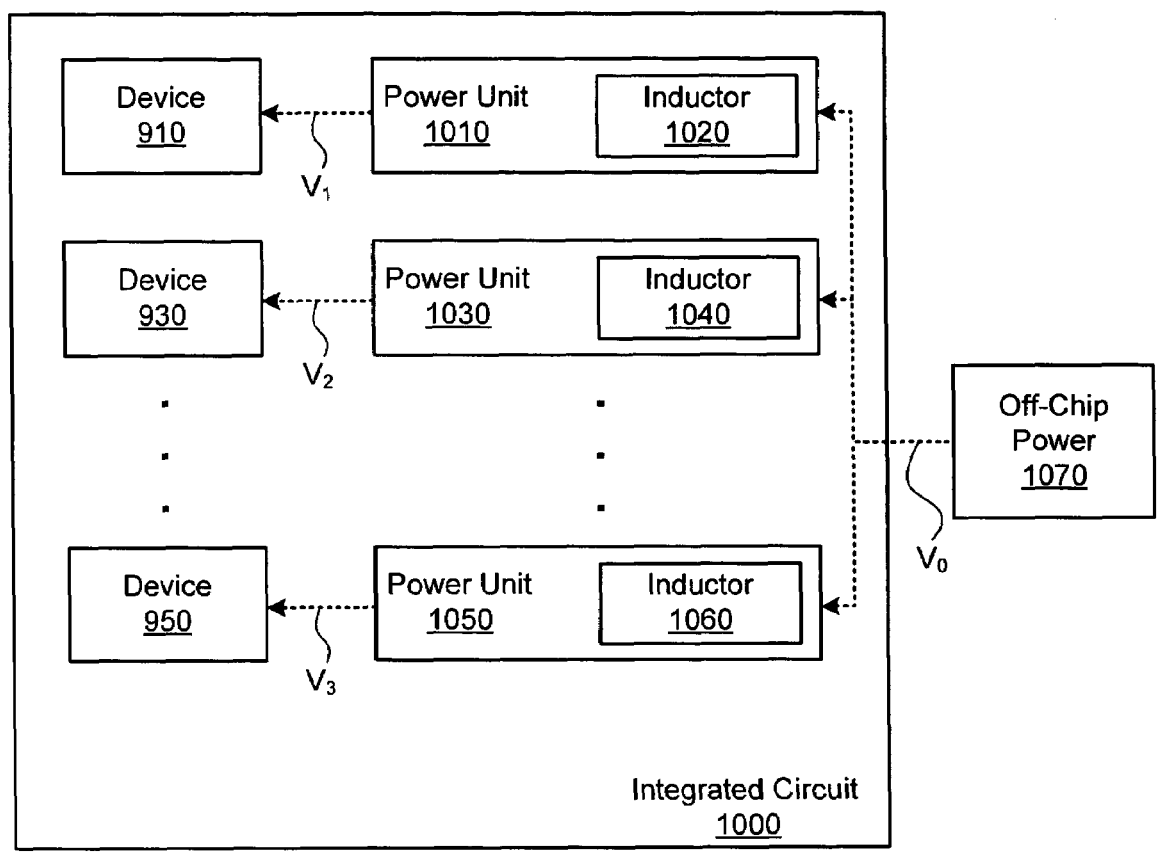
FIG. 10 illustrates a block diagram of an integrated circuit including an inductor of an embodiment as part of a power unit

FIG. 10 illustrates a block diagram of an integrated circuit including an inductor of an embodiment as part of a power unit. More specifically, FIG. 1000 shows that one or more power units 1010, 1030, and 1050, including inductors 1020, 1040, and 1060 respectively, may be integrated in an integrated circuit 1000 with any suitable one or more integrated circuit devices, such as integrated circuit devices 910, 930, and 950. Each inductor 1020, 1040, and 1060 may be structured and fabricated as described above. Although illustrated as having three inductors, the integrated circuit 1000 of an embodiment may be fabricated with any suitable number of one or more inductors. Further illustrated is off-chip power 1070 that provides a voltage of $V_O$ to each power unit. The power units 1010, 1030, and 1050, including inductors 1020, 1040, and 1060 respectively, may each convert $V_O$ to a different voltage (e.g., $V_1$, $V_2$, and $V_3$). Integrating the power unit(s) into the integrated circuit 1000 die may allow the off-chip power 970 to supply a higher voltage as the power units 1010, 1030, and 1050 may convert the higher input voltage to lower, regulated voltages on the integrated circuit 100 die closer to the integrated circuit devices that require the regulated voltages.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, also may mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, such as the examples given with reference to FIG. 1. For example, the memory unit may include any memory device, memory article, memory medium, storage device, storage article, storage medium and/or storage unit, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

What is claimed is:

1. An inductor comprising:
a plurality of metal lines; and
a slotted magnetic material adjacent to the metal lines, the slotted magnetic material comprising:
a seed layer;
a patterned insulator formed on the seed layer, the patterned insulator defining a plurality of slots; and
a magnetic material formed in the slots and coupled to the seed layer of magnetic material.

2. The inductor of claim 1 further comprising:
an insulator adjacent to the metal lines to insulate the metal lines from the slotted magnetic material.

3. The inductor of claim 1, the seed layer and magnetic material each comprising an alloy selected from the group of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoFeHfO, CoFeSiG, CoZrO, CoFeAlO, or a combination thereof.

4. The inductor of claim 1 further comprising:
another slotted magnetic material adjacent to the metal lines and opposite the slotted magnetic material, the other slotted magnetic material including a plurality of slots.

5. An integrated circuit comprising:
an integrated circuit device; and
an inductor coupled to the integrated circuit device, the inductor including
a plurality of metal lines; and
a slotted magnetic material adjacent to the metal lines, the slotted magnetic material comprising:
a seed layer;
a patterned insulator formed on the seed layer, the patterned insulator defining a plurality of slots;
a magnetic material formed in the slots and coupled to the seed layer of magnetic material, wherein at least a portion of the slotted magnetic material is deposited with electroless plating.

6. The integrated circuit of claim 5, the inductor further comprising: an insulator adjacent to the metal lines to insulate the metal lines from the slotted magnetic material.

7. The integrated circuit of claim 6, the slotted magnetic material comprising an alloy selected from the group of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoFeHfO, CoFeSiO, CoZrO, CoFeAlO, or a combination thereof.

8. A system comprising:
an off-chip power source; and
an integrated circuit coupled to the off-chip power source, the integrated circuit including one or more voltage converters, each voltage converter including an inductor, the inductor including
a plurality of metal lines; and
a slotted magnetic material adjacent to the metal lines, the slotted magnetic material comprising:
a seed layer;
a patterned insulator formed on the seed layer, the patterned insulator defining a plurality of slots; and
a magnetic material formed in the slots and coupled to the seed layer of magnetic material.

9. The system of claim 8, the slotted magnetic material comprising an alloy selected from the group of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoFeHfO, CoFeSiO, CoZrO, CoFeAlO, or a combination thereof.

10. The system of claim 8, the insulator selected from the group consisting of $SiO_2$, SiN, SiOF, SiOC, polyimide, a photosensitive insulating material, and any other low dielectric constant interlayer dielectric.

11. The system of claim 8, the integrated circuit further comprising a plurality of integrated circuit devices, each integrated circuit device coupled to the one or more voltage converters, and each voltage converter supplying a different voltage.

* * * * *